United States Patent
Madan et al.

(10) Patent No.: US 7,485,572 B2
(45) Date of Patent: Feb. 3, 2009

(54) METHOD FOR IMPROVED FORMATION OF COBALT SILICIDE CONTACTS IN SEMICONDUCTOR DEVICES

(75) Inventors: Anita Madan, Danbury, CT (US); Robert J. Purtell, West Jordan, UT (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/534,714

(22) Filed: Sep. 25, 2006

(65) Prior Publication Data

US 2008/0124925 A1    May 29, 2008

(51) Int. Cl.
*H01L 29/45* (2006.01)

(52) U.S. Cl. ............... 438/630; 438/682; 257/E21.438; 257/E21.627; 257/E21.641

(58) Field of Classification Search ........ 438/233, 438/630, 649, 651, 664, 682, 9, 230; 257/E21.438, 257/E21.593, E21.627, E21.641
See application file for complete search history.

(56) References Cited

U.S. PATENT DOCUMENTS

| | | | | |
|---|---|---|---|---|
| 5,728,625 | A * | 3/1998 | Tung .................... | 438/586 |
| 5,874,342 | A * | 2/1999 | Tsai et al. ............. | 438/301 |
| 5,902,129 | A * | 5/1999 | Yoshikawa et al. ..... | 438/592 |
| 6,184,132 | B1  | 2/2001 | Cantell et al. | |
| 6,207,562 | B1  | 3/2001 | Han | |
| 6,284,662 | B1 * | 9/2001 | Mikagi ................. | 438/706 |
| 6,316,362 | B1 * | 11/2001 | Inoue ................... | 438/682 |
| 6,346,477 | B1 * | 2/2002 | Kaloyeros et al. ..... | 438/680 |
| 6,361,662 | B1 * | 3/2002 | Chiba et al. ........... | 204/192.2 |
| 6,376,373 | B1 * | 4/2002 | Nakamura et al. ..... | 438/683 |
| 6,410,427 | B1 * | 6/2002 | Hu ....................... | 438/655 |
| 6,465,369 | B1  | 10/2002 | Teng et al. | |
| 6,559,018 | B1 * | 5/2003 | Liu et al. ............... | 438/303 |
| 6,566,254 | B1 * | 5/2003 | Mikagi ................. | 438/660 |
| 6,569,784 | B1 * | 5/2003 | Wang et al. ........... | 438/787 |
| 6,579,783 | B2  | 6/2003 | Saigal et al. | |
| 6,743,721 | B2 * | 6/2004 | Lur et al. .............. | 438/683 |
| 6,767,814 | B2 * | 7/2004 | Kwon et al. ........... | 438/592 |
| 6,849,555 | B2  | 2/2005 | Lee et al. | |
| 6,936,528 | B2  | 8/2005 | Koo et al. | |
| 7,220,632 | B2 * | 5/2007 | Jones ................... | 438/199 |
| 2002/0019119 | A1 * | 2/2002 | Saigal et al. .......... | 438/581 |
| 2003/0022487 | A1 * | 1/2003 | Yoon et al. ............ | 438/642 |

(Continued)

OTHER PUBLICATIONS

Byun, Jeong Soo, et al., "Effect of Deposition Temperature and Sputtering Ambient on In Situ Cobalt Silicide Formation", J.Electrochem.Soc., vol. 144, No. 9, Sep. 1997, pp. 3175-3179.*

*Primary Examiner*—George Fourson
(74) *Attorney, Agent, or Firm*—Cantor Colburn LLP; Yuanmin Cai

(57) ABSTRACT

A method of forming silicide contacts for semiconductor devices includes subjecting a silicon containing semiconductor wafer to a degas treatment at a temperature of about 400° C., transferring the semiconductor wafer from a degas chamber to a deposition chamber, depositing a cobalt layer over the wafer at a point in time when the semiconductor wafer has cooled to temperature range of about 275-300° C., depositing a cap layer over the cobalt layer, and annealing the semiconductor wafer so as to create silicide contacts at portions on the wafer where cobalt is formed over silicon.

3 Claims, 3 Drawing Sheets

U.S. PATENT DOCUMENTS

| | | |
|---|---|---|
| 2003/0215962 A1 | 11/2003 | Hausmann et al. |
| 2003/0219965 A1* | 11/2003 | Cabral et al. ............... 438/592 |
| 2003/0228745 A1* | 12/2003 | Lur et al. ................... 438/586 |
| 2004/0092123 A1* | 5/2004 | Ikeda ........................ 438/719 |
| 2005/0196945 A1* | 9/2005 | Yun et al. .................. 438/586 |
| 2005/0221603 A1 | 10/2005 | Morad et al. |
| 2006/0057844 A1 | 3/2006 | Domenicucci et al. |
| 2006/0125022 A1* | 6/2006 | Kawamura ................. 257/384 |
| 2006/0163671 A1* | 7/2006 | Gulari et al. ............... 257/388 |
| 2006/0189050 A1* | 8/2006 | Jones ........................ 438/154 |
| 2006/0211202 A1* | 9/2006 | Byun et al. ................. 438/258 |

* cited by examiner

METHOD FOR IMPROVED FORMATION OF COBALT SILICIDE CONTACTS IN SEMICONDUCTOR DEVICES

BACKGROUND

The present invention relates generally to semiconductor device processing techniques and, more particularly, to an improved method for forming silicide contacts on semiconductor devices using cobalt as the deposited metal.

In the manufacture of semiconductor devices, salicide (or self-aligned silicide) materials are formed upon gate conductors and diffusion regions to reduce the line resistance of a CMOS device, thereby improving the speed characteristics thereof. In salicide technology, a refractory metal or a near noble metal, such as titanium for example, is deposited on a silicon substrate. The deposited metal is then annealed, thereby forming a silicide layer only on the exposed areas of the substrate. The areas of unreacted metal left on the dielectric may then be selectively etched away without a masking step. Thus, the process is "self-aligning."

As circuit devices have continued to shrink in size, however, it has been found that titanium silicide ($TiSi_2$) becomes an unsatisfactory silicide material since the sheet resistance thereof begins to sharply increase when the linewidth of the device decreases below 0.20 µm. More recently, cobalt disilicide ($CoSi_2$) has been used as a replacement for titanium in salicide structures since it does not suffer from a linewidth dependent sheet resistance problem. On the other hand, the use of cobalt silicide structures is not without its own drawbacks. For example, unlike titanium, a cobalt layer requires a cap layer such as titanium nitride (TiN) due to the sensitivity of cobalt to contaminants during the annealing process.

In addition, the quality control of silicide contacts in general becomes an increasingly difficult problem with smaller dimensions and more complex material mixtures. For instance, silicide growth may be non-uniform due to preferred growth along certain crystal planes or different levels of defect density due to implant damage or from silicon regrowth following anneal sequences. Accordingly, it would be desirable to be able to improve upon the manner in which the cobalt/silicon interface is initially formed, so as to improve the quality of the cobalt monosilicide and, subsequently, the cobalt disilicide. This would, in turn, improve the etch resistance and thermal degradation of the silicide material.

SUMMARY

The foregoing discussed drawbacks and deficiencies of the prior art are overcome or alleviated by a method of forming silicide contacts for semiconductor devices includes subjecting a silicon containing semiconductor wafer to a degas treatment at a temperature of about 400° C., transferring the semiconductor wafer from a degas chamber to a deposition chamber, depositing a cobalt layer over the wafer at a point in time when the semiconductor wafer has cooled to temperature range of about 275-300° C., depositing a cap layer over the cobalt layer, and annealing the semiconductor wafer so as to create silicide contacts at portions on the wafer where cobalt is formed over silicon.

In another embodiment, a method of improved formation of cobalt silicide contacts for a semiconductor device. In an exemplary embodiment, the method includes heating a silicon containing semiconductor wafer to a temperature within a range of about 275-300° C., depositing a cobalt layer over a silicon containing wafer while the wafer is still within the temperature range of about 275-300° C., and annealing the semiconductor wafer so as to create silicide contacts at portions on the wafer where cobalt is formed over silicon.

TECHNICAL EFFECTS

As a result of the summarized invention, a solution is technically achieved in which a cobalt metal layer is deposited over a semiconductor device at an elevated temperature of about 275-300° C., thereby promoting the growth of an amorphous layer of cobalt containing silicon. This in turn results in smoother and thicker cobalt disilicide structures, as well as fewer grain boundaries.

BRIEF DESCRIPTION OF THE DRAWINGS

Referring to the exemplary drawings wherein like elements are numbered alike in the several Figures.

DETAILED DESCRIPTION

Disclosed herein is a method for improved formation of cobalt silicide contacts for a semiconductor device. Briefly stated, the present embodiments provide an improved interfacial layer of cobalt and silicon atoms during the cobalt deposition, as the result of a high temperature degas prior to the cobalt deposition. The high temperature degas, in turn, allows the wafer temperature to be maintained at an elevated temperature of about 275-300° C. following transit, thereby promoting a thicker interfacial layer. However, by allowing the wafer temperature to cool below 350° C., agglomeration of the cobalt on the spacers of the semiconductor devices is avoided.

Figure 1:
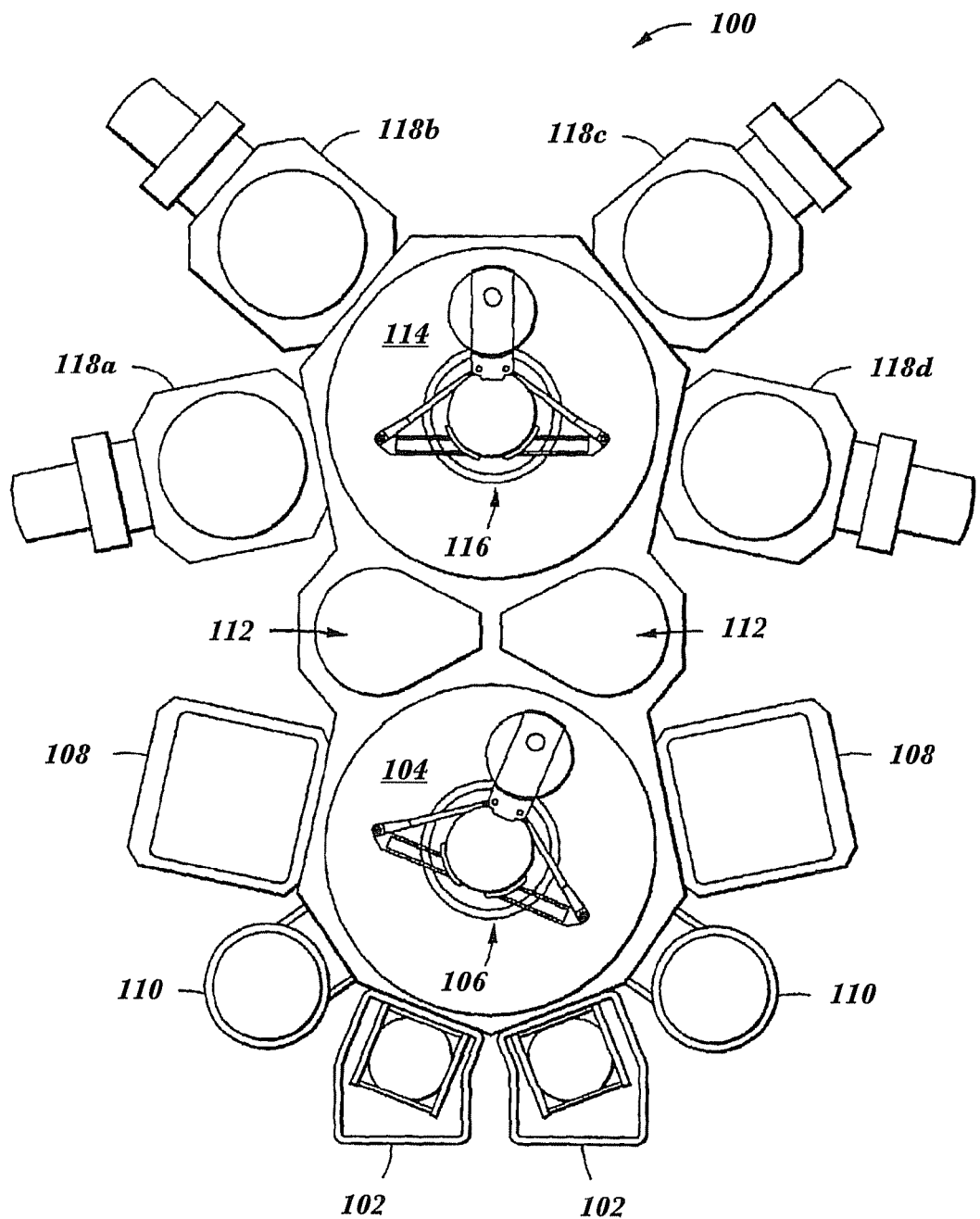
FIG. 1 is a schematic plan view of an exemplary cluster tool system having multiple substrate processing chambers, suitable for use in accordance with an embodiment of the invention.

Referring initially to FIG. 1, there is shown is a schematic view of an exemplary cluster tool system 100 having multiple substrate processing chambers, suitable for use in accordance with an embodiment of the invention. The cluster tool system 100 includes vacuum load/lock chambers 102 attached to a first stage transfer chamber 104. The load-lock chambers 102 maintain vacuum conditions within the first stage transfer chamber 104 while substrates enter and exit the system 100. A first robot 106 transfers substrates between the load-lock chambers 102 and one or more substrate processing chambers 108 and 110 attached to the first stage transfer chamber 104. Processing chambers 108 and 110 may be configured to perform a number of substrate processing operations such as, for example, chemical vapor deposition (CVD), physical vapor deposition (PVD), etching, pre-cleaning, degas, orientation, annealing and other substrate processes. The first robot 106 also transfers substrates to/from one or more transfer chambers 112 disposed between the first stage transfer chamber 104 and a second stage transfer chamber 114.

The transfer chambers 112 are used to maintain ultrahigh vacuum conditions in the second stage transfer chamber 114 while allowing substrates to be transferred between the first stage transfer chamber 104 and the second stage transfer chamber 114. A second robot 116 transfers substrates between the transfer chambers 112 and another plurality of substrate processing chambers 118a through 118d. Similar to processing chambers 108 and 110, the processing chambers 118a through 118d may be configured to perform a variety of substrate processing operations. For example, where the cluster tool system 100 is specifically configured to deposit a cobalt metal silicide film, processing chambers 110 may represent degas/orientation chambers, while chambers 108 may be pre-clean chambers. Further, chambers 118a and 118b may represent PVD chambers outfitted to deposit a cobalt film, while chamber 118c may be a PVD chamber outfitted to deposit a Ti/TiN capping layer. The transfer chambers 112 may be used cool down chambers, while chamber 118d can represent an optional chamber.

Figure 2:
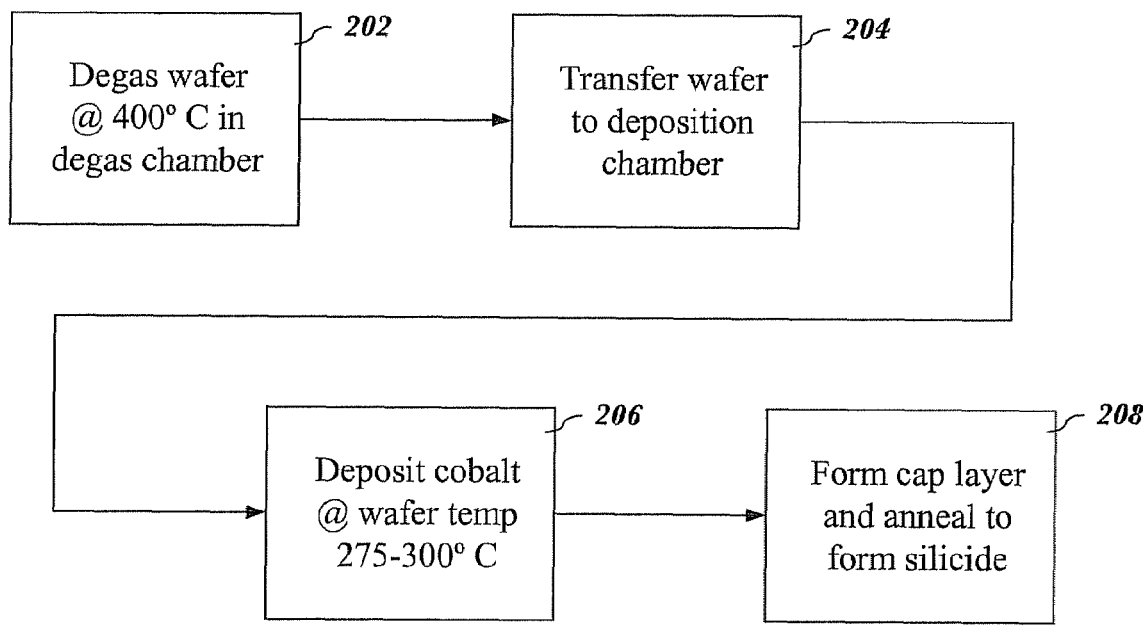
FIG. 2 is a process flow block diagram illustrating a method for improved formation of cobalt silicide contacts for a semiconductor device, in accordance with an embodiment of the invention.

Referring now to FIG. 2, there is shown a process flow block diagram 200 illustrating a method for improved formation of cobalt silicide contacts for a semiconductor device, in accordance with an embodiment of the invention. As shown in block 202, a semiconductor wafer is subjected to a degas treatment at a temperature of about 400° C. in a degas chamber 110 such as shown in FIG. 1, for example. Upon completion of the degas treatment, the heated wafer is transported to a deposition chamber as illustrated in block 204 of FIG. 2. Rather than heating the wafer in the deposition chamber itself, the wafer is instead slightly cooled from the degas temperature as a result of the transport between the degas and deposition chambers. In this manner, outgassed material removed during the degas heating will not get back onto the wafer during deposition. By way of example, the cooling time between degas and metal deposition may be on the order of about 30 seconds to about 5 minutes, and more particularly, about 1 minute.

Once inside the deposition chamber, the cobalt material is deposited over the wafer, as shown in block 206 of FIG. 2. In an exemplary embodiment, the wafer temperature at the time of deposition is on the order of about 275-300° C. As indicated above, it has been determined that cobalt deposition at such a range of elevated temperatures promotes better mixing of the cobalt and silicon atoms prior to silicide formation. By creating a relatively thick amorphous layer of silicon and cobalt, a more uniform silicide film can be subsequently formed, leading to a more stable film with respect to thermal degradation and reactive ion etch (RIE) attack. Finally, as shown in block 208 of FIG. 2, a cap layer (e.g., TiN, TaN) is formed over the deposited cobalt layer, and the wafer is annealed so as to create silicide contacts. Formation of the cap layer and annealing of the wafer may take place in separate chambers of the tool system 100 shown in FIG. 1.

Figure 3:
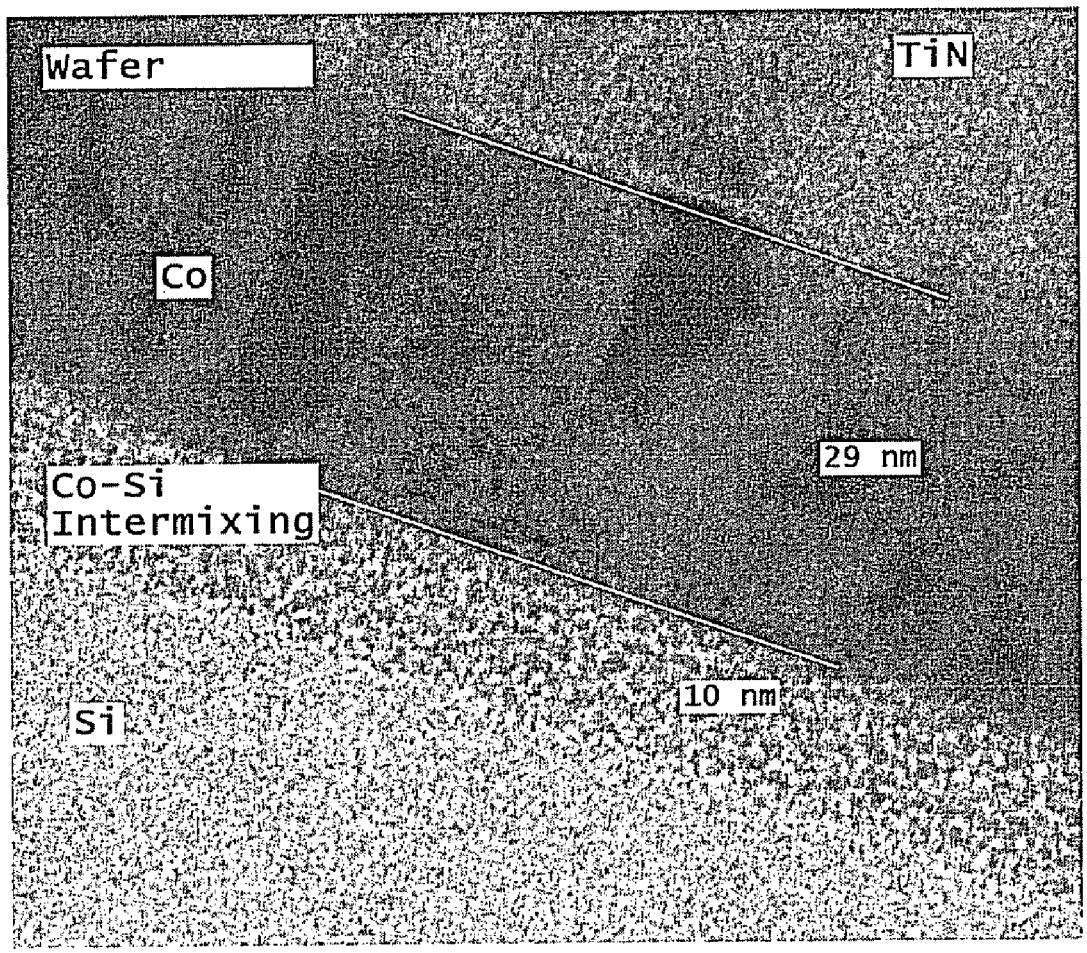
FIG. 3 is a scanning electron micrograph (SEM) photograph of a deposited cobalt and cap layer over a silicon substrate, in accordance with the method illustrated in FIG. 2.

FIG. 3 is a scanning electron micrograph (SEM) photograph of a deposited cobalt and cap layer over a silicon substrate, in accordance with the method illustrated in FIG. 2. As is shown, the high-temperature degas treatment creates an elevated wafer temperature immediately prior to subsequent cobalt deposition, resulting in a relatively thick (e.g., about 10 nm), uniform amorphous layer of cobalt-silicon at the cobalt/silicon interface. A TiN cap layer is also shown formed over the cobalt layer for contaminant protection during the silicide anneal process.

As a result of the above described cobalt deposition process, the quality of silicide contact may be improved, owing to the initial cobalt/silicon interface. Such silicide contacts provide improved immunity to thermal degradation and increased sheet resistance following the subsequent exposure of the silicide to WN etch processes. Still another benefit associated with a high temperature degas is the removal of additional carbon contamination.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming suicide contacts for semiconductor devices, the method comprising:
   subjecting a silicon containing semiconductor wafer to a degas treatment at a temperature of about 400° C.;
   transferring the semiconductor wafer from a degas chamber to a deposition chamber;
   depositing a cobalt layer over the wafer at a point in time when the semiconductor wafer has cooled to a temperature range of about 275- 300° C., without heating the wafer in the deposition chamber itself;
   depositing a cap layer over the cobalt layer; and
   annealing the semiconductor wafer so as to create silicide contacts at portions on the wafer where the cobalt layer is formed over silicon.

2. The method of claim 1, wherein the wafer is cooled for about 30 seconds to about 5 minutes between the degas treatment and the cobalt deposition.

3. The method of claim 1, wherein the wafer is cooled for about 1 minute between the degas treatment and the cobalt deposition.

* * * * *